(12) United States Patent
Akita

(10) Patent No.: US 8,949,062 B2
(45) Date of Patent: Feb. 3, 2015

(54) TEST MODULE, TEST APPARATUS, AND TEST METHOD

(75) Inventor: Tokunori Akita, Saitama (JP)

(73) Assignee: Advantest Corporation, Tokyo (JP)

( * ) Notice: Subject to any disclaimer, the term of this patent is extended or adjusted under 35 U.S.C. 154(b) by 1092 days.

(21) Appl. No.: 12/963,516

(22) Filed: Dec. 8, 2010

(65) Prior Publication Data

US 2011/0137605 A1      Jun. 9, 2011

Related U.S. Application Data

(63) Continuation of application No. PCT/JP2009/002576, filed on Jun. 8, 2009.

(30) Foreign Application Priority Data

Jun. 10, 2008    (JP) ................................. 2008-152191

(51) Int. Cl.
*G06F 19/00*         (2011.01)
*G01R 31/317*       (2006.01)

(52) U.S. Cl.
CPC ................................ *G01R 31/31725* (2013.01)
USPC ....................................................... 702/117

(58) Field of Classification Search
CPC ................... G01R 31/31725; G01R 31/31726; G01R 31/319; G01R 31/31917; G01R 31/31922; G01R 31/31932; G01R 31/31935; G01R 31/31937
USPC .............. 702/117–119, 124–126; 714/25, 30, 714/726, 736
See application file for complete search history.

(56) References Cited

U.S. PATENT DOCUMENTS

| | | | | |
|---|---|---|---|---|
| 6,751,717 | B2* | 6/2004 | Johnson | ......................... 711/167 |
| 2006/0036389 | A1* | 2/2006 | Ozora et al. | .................. 702/108 |
| 2007/0250743 | A1 | 10/2007 | Matsubara et al. | |
| 2008/0059091 | A1 | 3/2008 | Watanabe et al. | |
| 2010/0049453 | A1 | 2/2010 | Watanabe et al. | |

FOREIGN PATENT DOCUMENTS

| | | |
|---|---|---|
| CN | 1820206 | 8/2006 |
| JP | H04134800 | 5/1992 |

(Continued)

OTHER PUBLICATIONS

International Search Report (ISR) issued in PCT/JP2009/002576 (parent application) mailed in Sep. 2009 for Examiner consideration, citing U.S. Patent Application Publication Nos. 1, 4 and Foreign Patent document Nos. 1-4 listed above.
Written Opinion (PCT/ISA/237) issued in PCT/JP2009/002576 (parent application) mailed in Sep. 2009.

(Continued)

*Primary Examiner* — Manuel L Barbee

(57) ABSTRACT

Provided is a test module comprising a specified pattern detecting section that detects a specified pattern output in response to a specified test pattern from a device under test outputting output patterns in response to test patterns; a timing detecting section that detects a timing at which the specified pattern is detected; and a phase adjusting section that adjusts phases of the output patterns to match phases of expected value patterns, which are expected from the device under test as responses to the test patterns, based on the timing detected by the timing detecting section.

6 Claims, 4 Drawing Sheets

(56) References Cited

FOREIGN PATENT DOCUMENTS

| | | |
|---|---|---|
| JP | 2001-160802 A | 6/2001 |
| JP | 2005285160 | 10/2005 |
| JP | 2006-10651 A | 1/2006 |
| JP | 2006030090 | 2/2006 |
| JP | 2008020238 | 1/2008 |
| TW | 200602653 A | 11/2009 |
| WO | 2007/072738 A1 | 6/2007 |
| WO | 2008-023615 A1 | 2/2008 |

OTHER PUBLICATIONS

CN Office Action/ Search Report and English Translation dated Sep. 5, 2012; Application No. 2009801216034.

JP Office Action/ Search Report and Computer Translation Dated Mar. 26, 2013; Application No. 2010-516749.

TW Office Action and English Translation Dated Dec. 5, 2012; Application No: 098119443.

JP Office Action and Machine Translation dated Feb. 25, 2014; Application Number: 2010-516749.

\* cited by examiner

TEST MODULE, TEST APPARATUS, AND TEST METHOD

BACKGROUND

1. Technical Field

The present invention relates to a test module, a test apparatus, and a test method. In particular, the present invention relates to a test module, a test apparatus, and a test method for performing phase correction, with respect to an input signal, on an output signal from an output terminal of a device under test.

2. Related Art

A test apparatus tests a device under test (DUT), which is a test target, based on a test program. The test program includes, for each command cycle, commands to be executed by the test apparatus and expected value patterns to be compared with a test pattern output to each terminal of the device under test or an output pattern output from each terminal of the device under test.

It is possible that, with the device under test, the number of cycles from when a test pattern is input to when an output pattern corresponding to this test pattern is output is unknown or inconsistent. When comparing the output patterns output by such a device under test to expected value patterns, the test apparatus preferably has a function, e.g. a hunt function, to detect the output of a predetermined header pattern from the device under test and to compare an expected value pattern to a target output pattern that is output a specified number of cycles after the header pattern.

For example, Patent Document 1 discloses a test apparatus and a test method for synchronizing the output of an output pattern sequence with the reading of an expected value pattern sequence in order to perform the comparison. This test apparatus includes a header pattern detecting section that, when a detection start command ordering the start of a search for the pattern header sequence is executed, detects whether the pattern header pattern is output from the device under test, and a timing adjusting section that, when the pattern header sequence is detected, synchronizes the expected value pattern and the output pattern to input both patterns to an expected value comparing section in the same cycle.

Patent Document 1: Japanese Patent Application Publication No. 2006-10651

Conventionally, in order to obtain a phase shift of the DUT output, which is the goal of the hunt function, the header pattern is supplied to the DUT, the output patterns from the DUT are accumulated, and a prescribed pattern corresponding to the header pattern is detected. Here, the amount of output patterns accumulated from the DUT must be at least equal to the length of the header pattern and a hunt delay amount is added to sufficiently exceed the necessary phase shift amount. When performing match detection simultaneously for all bits resulting from the hunt delay added to the length of the header pattern, if the hunt delay is large, the number of match detection circuits provided in parallel increases, thereby increasing circuit size.

SUMMARY

Therefore, it is an object of an aspect of the innovations herein to provide a reception device, a test apparatus, a reception method, and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test module comprising a test pattern generating section that generates a test pattern to be supplied to a device under test; an expected value pattern generating section that generates an expected value pattern that is expected as a response from the device under test when the test pattern is supplied to the device under test; a pattern comparing section that compares the expected value pattern to an output pattern that is output by the device under test when the device under test is supplied with the test pattern; a specified pattern detecting section that detects a specified pattern output in response to a specified test pattern from a device under test outputting output patterns in response to test patterns; a timing detecting section that detects a timing at which the specified pattern is detected; and a phase adjusting section that adjusts phases of the output patterns to match phases of expected value patterns, which are expected from the device under test as responses to the test patterns, based on the timing detected by the timing detecting section.

Also provided is a test module comprising a specified pattern detecting section that detects a specified pattern output in response to a specified test pattern from a device under test outputting output patterns in response to test patterns; a timing detecting section that detects a timing at which the specified pattern is detected; and a phase adjusting section that adjusts phases of the output patterns to match phases of expected value patterns, which are expected from the device under test as responses to the test patterns, based on the timing detected by the timing detecting section.

The specified pattern detecting section can include an input data storage section that sequentially stores, as input data, data of the output patterns; a match detecting section that detects a match between the input data stored in the input data storage section and the specified pattern; and a result storage section that sequentially stores detection results of the match detecting section. The input data storage section can store the input data for each detection cycle, the match detecting section can detect a match between the input data and the specified pattern for each detection cycle, and the result storage section can sequentially store the detection results for each detection cycle. The timing detecting section can detect, in the detection result of each detection cycle stored in the result storage section, a timing at which the specified pattern is detected based on a bit position of the result storage section for which the detection result indicates a match. The input data storage section may be a latch circuit having a number of stages corresponding to length of the specified pattern, the match detecting section may be a plurality of comparison circuits connected in parallel, a number of the comparison circuits corresponding to the length of the specified pattern, and the result storage section may be a pipeline circuit having a number of stages corresponding to a maximum delay of the specified pattern.

According to a second aspect related to the innovations herein, provided is a test apparatus comprising a test pattern generating section that generates a test pattern to be supplied to a device under test; an expected value pattern generating section that generates an expected value pattern that is expected as a response from the device under test when the test pattern is supplied to the device under test; a pattern comparing section that compares the expected value pattern to an output pattern that is output by the device under test when the device under test is supplied with the test pattern; a specified pattern detecting section that detects a specified pattern output in response to a specified test pattern from a device under test outputting output patterns in response to test patterns; a timing detecting section that detects a timing at which the specified pattern is detected; and a phase adjusting section that adjusts phases of the output patterns to match phases of expected value patterns, which are expected from the device under test as responses to the test patterns, based on the timing detected by the timing detecting section.

Also provided is a test apparatus including the test module described above.

According to a third aspect related to the innovations herein, provided is a test method comprising generating a test pattern to be supplied to a device under test; generating an expected value pattern that is expected as a response from the device under test when the test pattern is supplied to the device under test; comparing the expected value pattern to an output pattern that is output by the device under test when the device under test is supplied with the test pattern; detecting a specified pattern output in response to a specified test pattern from a device under test outputting output patterns in response to test patterns; detecting a timing at which the specified pattern is detected; and adjusting phases of the output patterns to match phases of expected value patterns, which are expected from the device under test as responses to the test patterns, based on the detected timing.

Also provided is a test method comprising detecting a specified pattern output in response to a specified test pattern from a device under test outputting output patterns in response to test patterns; detecting a timing at which the specified pattern is detected; and adjusting phases of the output patterns to match phases of expected value patterns, which are expected from the device under test as responses to the test patterns, based on the detected timing.

Detecting a specified pattern may include sequentially storing, as input data, data of the output patterns; detecting a match between the stored input data and the specified pattern; and sequentially storing the detection results in a result storage section. Sequentially storing, as input data, data of the output patterns may include storing the input data for each detection cycle, detecting a match may include detecting a match between the stored input data and the specified pattern for each detection cycle, and sequentially storing the detection results may include sequentially storing the detection results in the result storage section for each detection cycle. Detecting a timing may include detecting, in the detection result of each detection cycle stored in the result storage section, a timing at which the specified pattern is detected from a bit position for which the detection result of the result storage section indicates a match.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
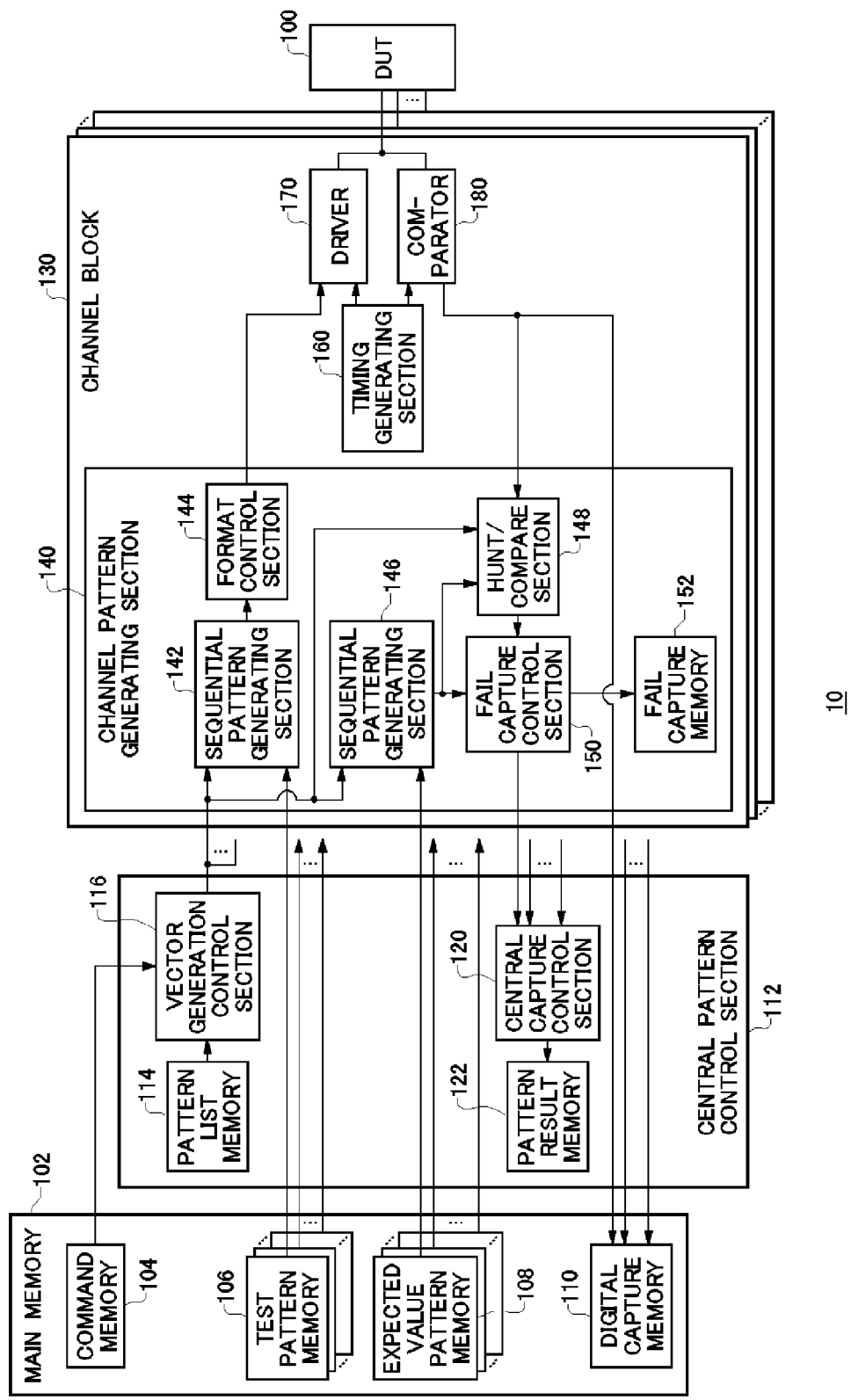
FIG. 1 shows a configuration of a test module 10.

FIG. 1 shows a configuration of a test module 10. The test module 10 is a test apparatus for testing a DUT 100 that has one or more terminals. The test module 10 includes a main memory 102, a central pattern control section 112, and a plurality of channel blocks 130.

The main memory 102 stores a test program for the DUT 100 and records output patterns output by the DUT 100 as the result of performing the test program. The main memory 102 includes a command memory 104, a plurality of test pattern memories 106, a plurality of expected value pattern memories 108, and a digital capture memory 110.

The command memory 104 stores each of the commands contained in the test program. Each test pattern memory 106 is provided to correspond to a terminal of the DUT 100, and stores for the corresponding terminal, in association with each command, a test pattern sequence used in a command cycle period during which the commands are executed.

The test pattern sequence contains a plurality of test patterns to be sequentially output to the terminal of the DUT 100 during the command cycle period. For example, if the test module 10 outputs a 32-bit signal to the DUT 100 for one command cycle period, the test pattern memory 106 stores, in association with each command, a test pattern sequence including 32 test patterns corresponding to the 32-bit signal output during the one command cycle period.

Each expected value pattern memory 108 is provided to correspond to a terminal of the DUT 100, and stores, in association with each command, an expected value pattern sequence used during the command cycle period in which the commands are executed. Here, the expected value pattern sequence includes a plurality of expected value patterns to be sequentially compared to the plurality of output patterns output sequentially from the terminal of the DUT 100 during the command cycle period. The digital capture memory 110 records the output patterns output by the DUT 100 as a result of the execution of the test program.

In the above description, the command memory 104, the test pattern memories 106, the expected value pattern memories 108, and/or the digital capture memory 110 may be split and provided in a memory module that is independent from the main memory 102, or may be provided as different memory regions within the same memory module.

The central pattern control section 112 is connected to the main memory 102 and the channel blocks 130, and performs a common process for the terminals of the DUT 100. The central pattern control section 112 includes a pattern list memory 114, a vector generation control section 116, a central capture control section 120, and a pattern result memory 122.

For each main routine or each sub routine of the test program, the pattern list memory 114 stores a start/end address of the routine in the command memory 104, a start address of a test pattern in the test pattern memory 106, and a start address of an expected value pattern in the expected value pattern memory 108, for example. The vector generation control section 116 functions as a sequential control section together with the sequential pattern generating section 146, and sequentially executes the commands contained in the test program of the DUT 100 for each command cycle. More specifically, the vector generation control section 116 sequentially reads, from the pattern list memory 114, the commands from the start address to the end address for each routine, and sequentially performs these commands.

The central capture control section 120 receives pass/fail judgment results for each terminal of the DUT 100, from the channel blocks 130, and totals the pass/fail results of the DUT 100 for each routine. The pattern result memory 122 stores the pass/fail judgment results of the DUT 100 for each routine.

The channel blocks 130 are provide to correspond respectively to the terminals of the DUT 100. Each channel block 130 includes a channel pattern generating section 140, a timing generating section 160, a driver 170, and a comparator 180.

The channel pattern generating section 140 generates the expected value pattern sequence or the test pattern sequence used to test the terminal, and compares the output pattern sequence of the DUT 100 to the expected value pattern sequence. The channel pattern generating section 140 includes a sequential pattern generating section 142, a format control section 144, a sequential pattern generating section 146, a hunt/compare section 148, a fail capture control section 150, and a fail capture memory 152.

The sequential pattern generating section 142 may function as a test pattern generating section together with the vector generation control section 116. The sequential pattern generating section 142 generates the test patterns supplied to the DUT 100. The sequential pattern generating section 142 receives, from the vector generation control section 116, the start address of the test pattern sequence to be output in response to the executed routine. The sequential pattern generating section 142 reads the test pattern sequence from the test pattern memory 106, in order from the start address corresponding to each command cycle, and outputs the test pattern sequence sequentially to the format control section 144. The format control section 144 converts the test pattern sequence into a format for controlling the driver 170.

The sequential pattern generating section 146 may function as an expected value pattern generating section together with the vector generation control section 116. The sequential pattern generating section 146 generates the expected value pattern that is expected as a response from the device under test when the test pattern is supplied thereto. The sequential pattern generating section 146 receives from the vector generation control section 116 the stored address of the expected value pattern sequence corresponding to the executed routine. The sequential pattern generating section 146 reads the expected value patterns from the expected value pattern memory 108, sequentially from the start address, according to each command cycle, and sequentially outputs the expected value patterns to the hunt/compare section 148 and the fail capture control section 150.

The hunt/compare section 148 compares the expected value patterns to the output patterns output by the DUT 100 in response to the test patterns input thereto. The hunt/compare section 148 receives the output pattern sequence output by the DUT 100 via the comparator 180, and compares this output pattern sequence to the expected value pattern sequence. The hunt/compare section 148 may have a hunt function that begins comparing the output pattern sequence, whose output timing from the DUT 100 is inconsistent, to the expected value pattern sequence on a condition that a specified header pattern sequence is output from the DUT 100. In this case, the hunt/compare section 148 may begin searching for the header pattern sequence on a condition that a detection start command is executed to start searching for an output pattern sequence that matches the header pattern sequence. Using this hunt function, the hunt/compare section 148 adjusts the timing at which the output pattern sequence is compared to the expected value pattern sequence, based on the time needed from when the search for the header pattern is started to when the header pattern sequence is detected.

The fail capture control section 150 receives from the hunt/compare section 148 information concerning whether the output pattern sequence of the DUT 100 matches the expected value pattern sequence, and generates a pass/fail judgment result of the DUT 100 for the corresponding terminal. The fail capture memory 152 stores fail information including a value or the like of an output pattern that did not match the expected value or a result of the hunt process performed by the hunt/compare section 148.

The timing generating section 160 generates the timing at which the driver 170 outputs each test pattern in the test pattern sequence and the timing at which the comparator 180 acquires the output patterns of the DUT 100. The driver 170 outputs to the DUT 100 the test patterns output by the format control section 144 in the channel pattern generating section 140, at the timing designated by the timing generating section 160. The comparator 180 acquires the output patterns output from the terminals of the DUT 100, at the timing designated by the timing generating section 160, and supplies the output patterns to the digital capture memory 110 and the hunt/compare section 148 in the channel block 130.

Instead of including the sequential pattern generating section 142 and the sequential pattern generating section 146 as independent components, as described above, the channel pattern generating section 140 may include a common sequential pattern generating section that has the functions of both the sequential pattern generating section 142 and the sequential pattern generating section 146.

Figure 2:
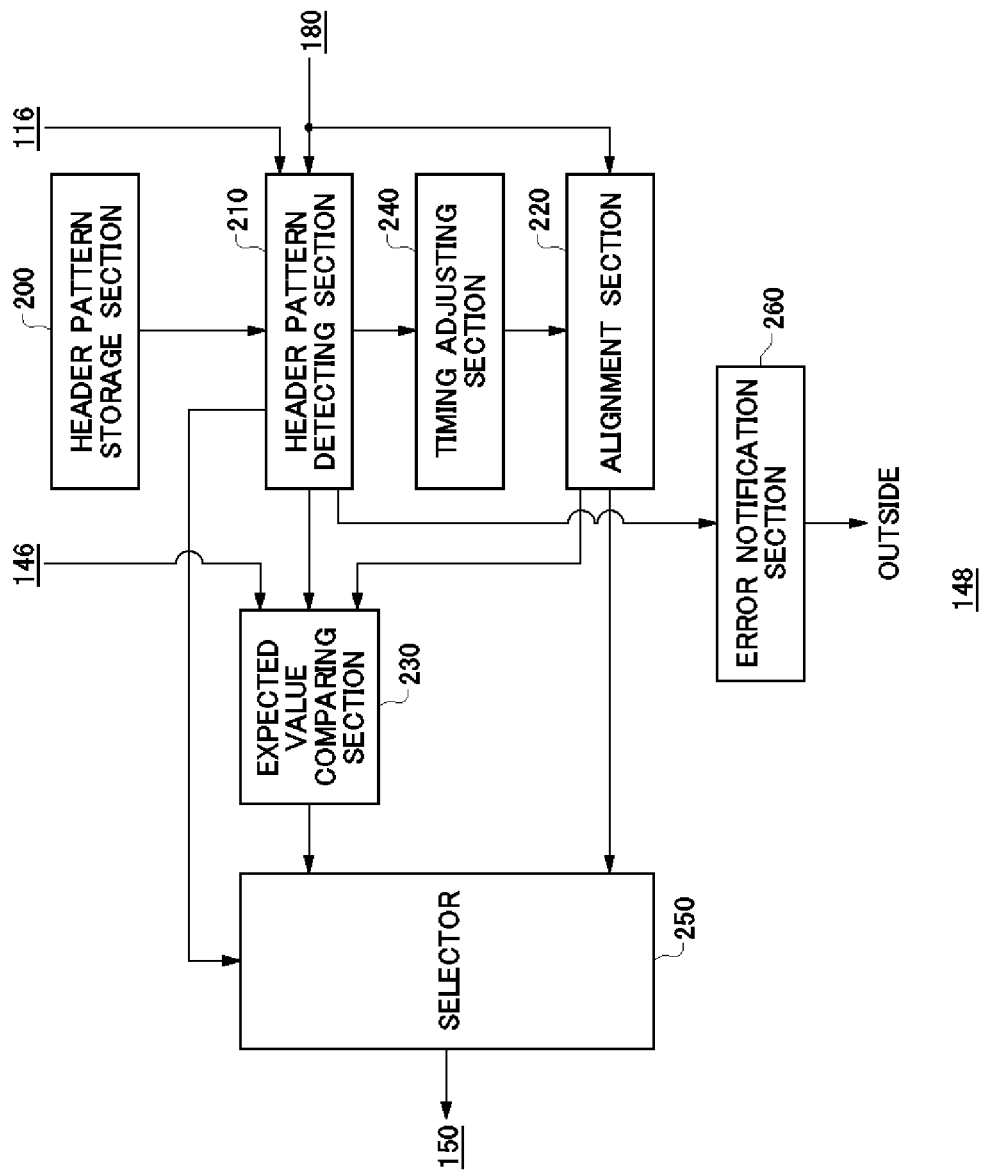
FIG. 2 shows a configuration of the hunt/compare section 148.

FIG. 2 shows a configuration of a hunt/compare section 148. The hunt/compare section 148 includes a header pattern storage section 200, a header pattern detecting section 210, an alignment section 220, an expected value comparing section 230, a timing adjusting section 240, a selector 250, and an error notification section 260. The header pattern storage section 200 stores a plurality of header pattern sequences. The header pattern detecting section 210 judges whether a detection start command instructing initiation of a search for an output pattern sequence matching the header pattern sequence has been executed, based on a signal received from the vector generation control section 116. The detection start command includes instructions to select a header pattern sequence to be searched for from the header pattern storage section 200.

The header pattern detecting section 210 is an example of a specified pattern detecting section. When a specified test pattern is provided to the DUT 100, the header pattern detecting section 210 detects the specified pattern output as a response to the specified test pattern from the output patterns. When the detection start command is issued, the header pattern detecting section 210 selects a header pattern sequence to be searched for from the header pattern storage section 200, based on the detection start command. The header pattern detecting section 210 detects whether an output pattern sequence that matches the header pattern sequence selected based on the detection start command is output from the DUT 100. More specifically, the header pattern detecting section 210 searches for an output pattern sequence matching the header pattern sequence from among the output signals from the comparator 180.

The timing adjusting section 240 may have the function of a timing detecting section that detects the timing at which the specified pattern is output. When an output pattern sequence matching the header pattern sequence is detected, the timing adjusting section 240 sets in the alignment section 220 a parameter for adjusting the output timing of the output pattern sequence, based on the time that has passed from when search for the pattern header sequence was started to when the pattern header sequence is detected. For example, the timing adjusting section 240 may set in the alignment section 220 a phase shift amount by which the output pattern sequence is phase-shifted. By setting an appropriate phase shift amount, the output pattern sequence can be synchronized with the expected value pattern.

The alignment section 220 is an example of a phase adjusting section. The alignment section 220 may adjust the phase of the output pattern to match the phase of the expected value pattern, based on the timing detected by the timing detecting section. The alignment section 220 receives from the comparator 180 the output pattern sequence output from the DUT 100. The alignment section 220 phase-shifts the received output pattern sequence by the phase shift amount set in the timing adjusting section 240, and transmits the resulting output pattern sequence to the expected value comparing section 230 and the selector 250. If the header pattern sequence has yet to be detected, the alignment section 220 may output the output pattern sequence without phase-shifting it.

More specifically, the alignment section 220 includes a plurality of flip-flops connected in cascade, and a selector that selects the output from one of these flip-flops and outputs the selected output. The first-stage flip-flop sequentially receives the output pattern sequence. The selector selects the output of one of the flip-flops based on the phase shift amount set in the timing adjusting section 240, and outputs the selected output. As a result, the alignment section 220 can change the number of flip-flops that an output pattern passes through, and can therefore match the timings of the output pattern sequence and the expected value pattern sequence.

When the header pattern sequence is detected, the expected value comparing section 230 compares the output pattern sequence received from the alignment section 220 to the expected value pattern received from the sequential pattern generating section 146, and sequentially sends the comparison results to the selector 250. When the header pattern sequence is detected, the selector 250 receives the comparison results from the expected value comparing section 230 and transmits the comparison results to the fail capture control section 150. On the other hand, when the header pattern sequence is not detected, the selector 250 transmits the output pattern sequence received from the alignment section 220 to the fail capture control section 150.

If an output pattern sequence matching a header pattern sequence is not detected within a specified time from when the search for the pattern header sequence started, the error notification section 260 notifies a user of the test module 10 that the header pattern detection has failed. As a result, the user is made aware of the error indicating that the header pattern sequence cannot be detected, and can easily examine the cause of this error by investigating the output pattern sequence up to when the error occurred, which is stored in the fail capture memory 152.

Figure 3:
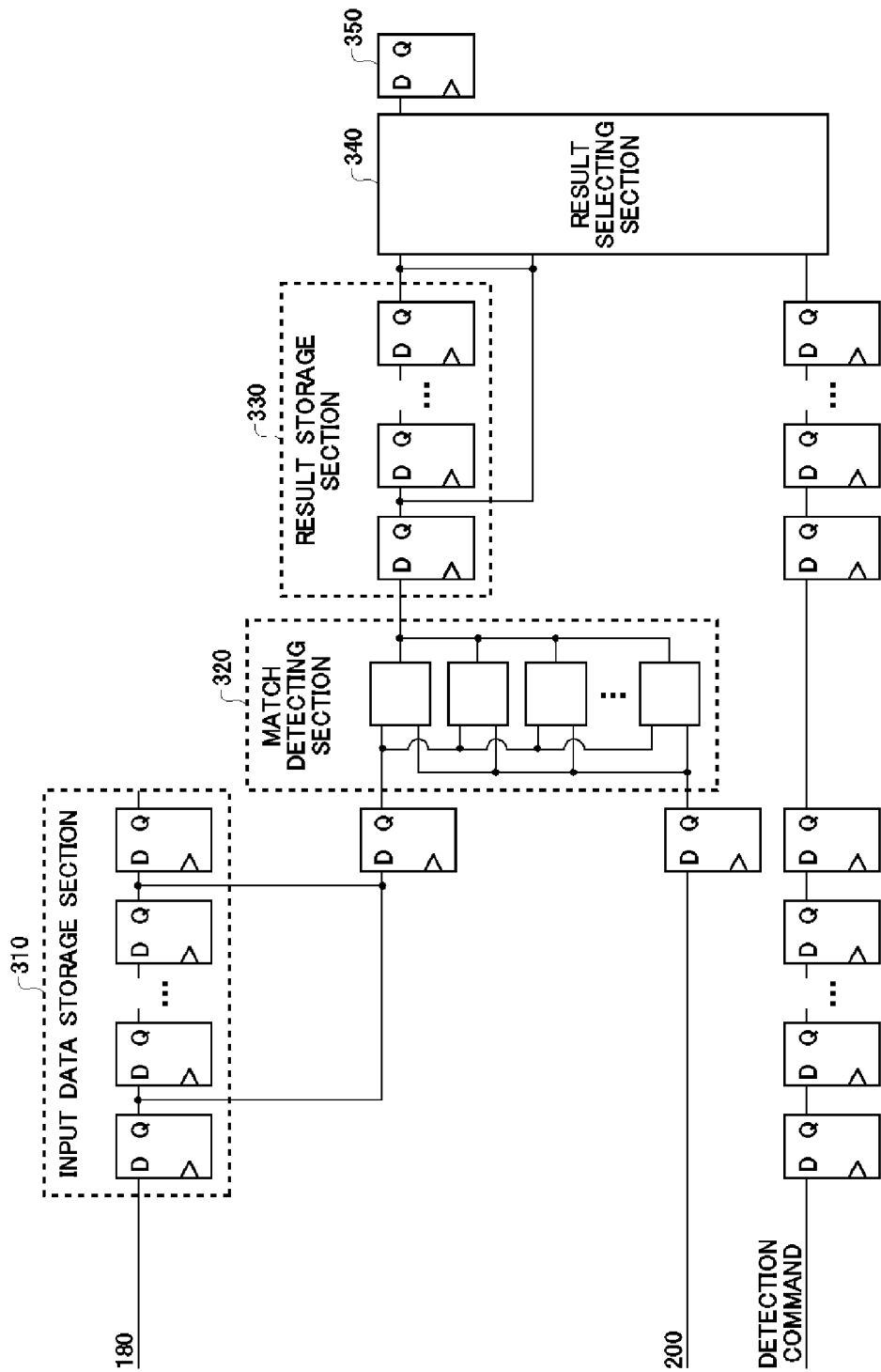
FIG. 3 shows an exemplary header pattern detecting section 210.

FIG. 3 shows an exemplary header pattern detecting section 210. The header pattern detecting section 210 includes an input data storage section 310, a match detecting section 320, a result storage section 330, a result selecting section 340, and a selection result storage section 350.

The input data storage section 310 sequentially stores the data of the output patterns as input data. The input data storage section 310 stores the input data for each detection cycle. The input data storage section 310 may be a latch circuit having a number of stages corresponding to the length of the specified pattern.

The match detecting section 320 detects a match between the specified pattern and the input data stored in the input data storage section. The match detecting section 320 detects a match between the specified pattern and the input data for each detection cycle. The match detecting section 320 may be a plurality of comparison circuits connected in parallel, where the number of comparison circuits corresponds to the length of the specified pattern.

The result storage section 330 sequentially stores the detection results of the match detecting section. The result storage section 330 sequentially stores the detection results for each detection cycle. The result storage section 330 may be a pipeline circuit having a number of stages corresponding to the maximum delay of the specified pattern.

The result selecting section 340 is an example of a timing detecting section. The result selecting section 340 detects the timing at which the specified pattern is detected, based on a bit position of the result storage section 330 indicating that the detection results match, for the detection results in each detection cycle stored in the result storage section 330.

The result selecting section 340 detects the beginning of the header pattern at a timing of the detection command when the hunt delay process has ended. For example, assuming that the number of bits in one cycle is 40, when the beginning of the header is detected at the fourth bit of the fifth cycle from the detection command, the phase shift amount, i.e. the selection result, is 163 UI. When a plurality of header patterns are detected, the data having the earliest phase is detected as the detection result.

The selection result storage section 350 stores the selection result selected by the result selecting section 340. The selection result stored in the selection result storage section 350 is provided to the timing adjusting section 240 as the phase shift amount.

Figure 4:
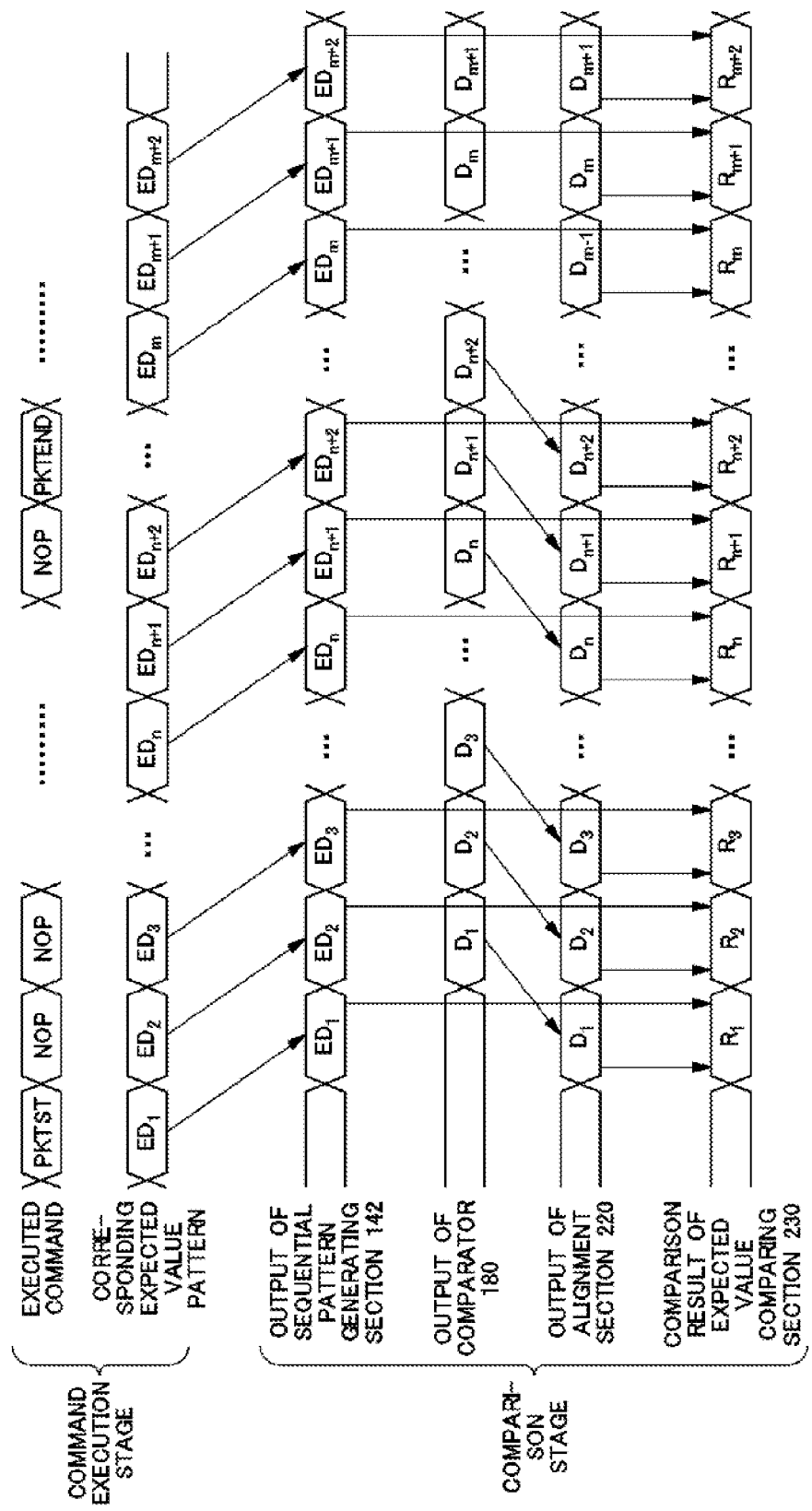
FIG. 4 shows the timing of the process for comparing an expected value pattern sequence and an output pattern sequence.

FIG. 4 shows the timing of the process for comparing the expected value pattern sequence and the output pattern sequence. The vector generation control section 116 executes each command using a command execution pipeline with a plurality of stages including a command execution stage for executing a command and a comparison stage for comparing an output pattern to an expected value pattern. More specifically, in the command execution stage, the vector generation control section 116 sequentially executes, for each command cycle, a plurality of commands including a PKTST command instructing initiation of the header pattern sequence detection and a PKTEND command instructing ending of the header pattern sequence detection. The PKTST command is an example of a detection start command and the PKTEND command is an example of a detection end command.

The sequential pattern generating section 146 sequentially reads from the expected value pattern memory 108 the expected value patterns corresponding to a plurality of commands. For example, the sequential pattern generating section 146 may read ED1, which is the expected value pattern corresponding to the PKTST command. The sequential pattern generating section 146 may read ED2, which is the expected value pattern corresponding to the NOP command following the PKTST command. The comparison stage is performed after the command execution stage, and therefore the input timing of the expected value pattern sequence in the comparison stage is later than the timing at which the corresponding commands are executed during the command execution stage.

In the comparison stage, the comparator 180 acquires the output patterns output from the corresponding terminal of the DUT 100 and supplies the output patterns to the hunt/compare section 148. For example, the comparator 180 may sequentially acquire the output pattern sequence D1, D2, D3, . . . , Dn, Dn+1, Dn+2, and supply this output pattern sequence to the hunt/compare section 148. The alignment section 220 phase-shifts the output pattern sequence by the phase shift amount set in the timing adjusting section 240, and outputs the resulting output pattern sequence to the expected value comparing section 230.

More specifically, by setting a suitable phase shift amount in the alignment section 220, the timing adjusting section 240 performs an adjustment to input the output pattern sequence D1, D2, D3, which is to be compared to the expected value pattern sequence ED1, ED2, ED3, into the comparison stage at the timing at which ED1, ED2, and ED3 are input to the comparison stage. Similarly, the timing adjusting section 240 inputs the output pattern sequence Dn, Dn+1, Dn+2, which is to be compared to the expected value pattern sequence EDn, EDn+1, EDn+2, into the comparison stage at the same time as the timing at which EDn, EDn+1, and EDn+2 are input to the comparison stage. As a result, the timing adjusting section 240 can synchronize each expected value pattern with the output pattern to be compared to this expected value pattern, and input each expected value pattern and corresponding output pattern into the expected value comparing section 230 in the same cycle.

According to the test module 10 of the present embodiment, even when the start timing is inconsistent for the output of output patterns from the DUT 100, the expected value patterns and the output patterns can be synchronized.

When the vector generation control section 116 executes a PKTEND command, the timing adjusting section 240 performs a setting for the alignment section 220 to not phase-shift the output patterns. As a result, the alignment section 220 outputs the received output pattern sequence to the expected value comparing section 230 without phase-shifting it. More specifically, after the execution of the PKTEND command, the sequential pattern generating section 146 reads the expected value pattern sequence EDm, EDm+1, EDm+2. The comparison stage is performed after the command execution stage, and therefore the timing at which the expected value pattern sequence is input to the comparison stage is later than the timing at which the corresponding commands are executed in the command execution stage.

In the comparison stage, the comparator 180 sequentially acquires the output pattern sequence Dm−1, Dm, Dm+1, and supplies this output pattern sequence to the hunt/compare section 148. The alignment section 220 outputs the output pattern to the expected value comparing section 230 without phase-shifting the output pattern. As a result, the expected value comparing section 230 compares the output pattern Dm−1to the expected value pattern EDm, and writes the comparison result Rm to the fail memory.

In this way, when a PKTEND command is executed, the timing adjusting section 240 returns the phase shift amount set in the alignment section 220 to be the phase shift amount used prior to the detection of the header pattern. As a result, the timing adjusting section 240 can input an expected value pattern associated with a command into the expected value comparing section 230 in the same cycle as the output pattern acquired from the DUT 100 when this command is executed. Therefore, the timing adjusting section 240 can control whether an expected value pattern and an output pattern are synchronized during a portion of the DUT 100 testing.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test module comprising:
    a specified pattern detecting section that detects a specified pattern output in response to a specified test pattern from a device under test outputting output patterns in response to test patterns;
    a timing detecting section that detects a timing at which the specified pattern is detected; and
    a phase adjusting section that adjusts phases of the output patterns to match phases of expected value patterns, which are expected from the device under test as responses to the test patterns, based on the timing detected by the timing detecting section wherein
    the specified pattern detecting section includes:
    a match detecting section that detects a match between data of the output patterns and the specified pattern for each detection cycle; and
    a result storage section that sequentially stores detection results of the match detecting section for each detection cycle, and
    the timing detecting section detects, in the detection result of each detection cycle stored in the result storage section, a timing at which the specified pattern is detected based on a bit position of the result storage section for which the detection result indicates a match.

2. The test module according to claim 1, wherein
    the specified pattern detecting section further includes TB an input data storage section that sequentially stores for each detection cycle, as input data, the data of the output patterns, and
    the match detecting section detects a match between the input data stored in the input data storage section and the specified pattern for each detection cycle.

3. The test module according to claim 2, wherein
    the input data storage section is a latch circuit having, a number of stages corresponding to length of the specified pattern,
    the match detecting section is a plurality of comparison circuits connected in parallel, a number of the comparison circuits corresponding to the length of the specified pattern, and
    the result storage section is a pipeline circuit having a number of stages corresponding to a maximum delay of the specified pattern.

4. A test apparatus comprising the test module according to claim 2.

5. A test method performed by a test module for use in a test apparatus, the test method comprising:
    detecting, by a specified pattern detecting section of the test module, a specified pattern output in response to a specified test pattern from a device under test outputting output patterns response to test patterns;
    detecting, by a timing detection section of the test module, a timing at which the specified pattern is detected; and adjusting, by a phase adjusting section of the test module, phases of the output Patterns to match phases of expected value patterns, which are expected from the device under test as responses to the test patterns, based on the detected timing, wherein said detecting a specified pattern includes; each detection cycle; and sequentially storing detection results of said detecting a match in a result storage section for each detection cycle, and said detecting a timing includes detecting, in the detection result of each detection cycle stored in the result storage section, a timing at which the specified pattern is detected from a bit. position for which the detection result of the result storage section indicates a match.

6. The test method according to claim 5, wherein said detecting a specified pattern further includes sequentially storing for each detection cycle, as input data, the data of the output patterns, and said detecting a match includes detecting a match between the stored input data and the specified pattern for each detection cycle.

\* \* \* \* \*